United States Patent [19]

Sugiyama et al.

[11] Patent Number: 5,600,170
[45] Date of Patent: Feb. 4, 1997

[54] INTERCONNECTION STRUCTURE OF SEMICONDUCTOR DEVICE

[75] Inventors: Masao Sugiyama; Hiroyuki Amishiro; Keiichi Higashitani, all of Hyogo, Japan

[73] Assignee: Mitsubishi Denki Kabushiki Kaisha, Tokyo, Japan

[21] Appl. No.: 479,735

[22] Filed: Jun. 7, 1995

[30] Foreign Application Priority Data

Dec. 26, 1994 [JP] Japan .................................... 6-322292

[51] Int. Cl.$^6$ .......................... H01L 29/76; H01L 29/94; H01L 31/062; H01L 31/113
[52] U.S. Cl. .......................... 257/382; 257/383; 257/388; 257/763; 257/768
[58] Field of Search .................................... 257/382, 383, 257/388, 754, 774, 384, 763, 768, 764

[56] References Cited

U.S. PATENT DOCUMENTS

| 4,890,141 | 12/1989 | Tang et al. |  |
|---|---|---|---|
| 4,931,411 | 6/1990 | Tigelaar et al. |  |
| 5,459,354 | 10/1995 | Hara | 257/754 |
| 5,475,240 | 12/1995 | Sakamoto | 257/384 |

Primary Examiner—Carl Whitehead, Jr.
Attorney, Agent, or Firm—Lowe, Price, LeBlanc & Becker

[57] ABSTRACT

An interconnection structure of a semiconductor device with a gate electrode, an active region provided in the vicinity of the gate electrode and a first buried layer in a contact hole exposing the gate electrode and the active region. The contact hole is easily formed, and the first buried layer has a substantially low interconnection resistance value.

3 Claims, 17 Drawing Sheets

INTERCONNECTION STRUCTURE OF SEMICONDUCTOR DEVICE

BACKGROUND OF THE INVENTION

1. Field of the Invention

The present invention generally relates to an interconnection structure of a semiconductor device and a method of manufacturing the same, and more particularly, to an interconnection structure of a semiconductor device having a local interconnection structure for implementing miniaturization of the device, and a method of manufacturing the same.

2. Description of the Background Art

Recently, high speed operation and miniaturization of a semiconductor device have been more required. In order to satisfy these requirements, an interconnection structure used in the semiconductor device employs a so-called local interconnection structure, or the resistance of a conductive layer is reduced by introducing a silicide layer as a part of the conductive layer.

Description will now be given of a semiconductor device having a conventional local interconnection structure with reference to FIG. 28.

A gate electrode 4 is formed on the main surface of a silicon substrate 1 with a gate oxide film 10 interposed therebetween. A silicide film 5 for reducing the resistance of gate electrode 4 is formed on gate electrode 4. The sidewall of gate electrode 4 and silicide film 5 is covered with a sidewall oxide film 6.

Active regions 2a, 2b forming a source/drain region are formed a prescribed depth from the main surface of silicon substrate 1. Silicide layers 3a, 3b for implementing low resistance of active regions 2a, 2b are formed on the main surfaces of active regions 2a, 2b.

Here, a local interconnection of a titanium layer 7 and a titanium nitride layer 8 is formed, so that gate electrode 4 and active region 2a are connected. Gate electrode 4, titanium layer 7, and titanium nitride layer 8 are covered with an interlayer oxide film 9.

Description will now be given of the manufacturing process of a semiconductor device having the above described local interconnection structure.

Referring to FIG. 29, gate electrode 4 of polysilicon or the like having a prescribed shape is formed on silicon substrate 1 with gate oxide film 10 of a silicon oxide film or the like interposed therebetween. Then, with gate electrode 4 used as a mask, impurities are introduced into silicon substrate 1 to form active regions 2a, 2b.

Then, referring to FIG. 30, a silicon oxide film or the like is deposited a prescribed thickness on silicon substrate 1. By anisotropically etching the silicon oxide film, sidewall oxide film 6 is formed on the sidewall of gate electrode 4.

Referring to FIG. 31, a Co film or Ti film 3 is deposited on the surface of silicon substrate 1 with a sputtering method. Then, the film is subjected to lamp annealing, so that silicide film 5 and silicide layers 3a, 3b are formed on gate electrode 4 and active regions 2a, 2b, as shown in FIG. 32.

Referring to FIG. 33, titanium layer 7 and titanium nitride layer 8 are deposited on the entire surface of silicon substrate 1 with a sputtering method. Then, referring to FIG. 34, a resist film 12 with a prescribed pattern shape is formed on titanium nitride layer 8. With resist film 12 used as a mask, titanium nitride layer 8 and titanium layer 7 are etched. After removing resist film 12, an interlayer oxide film 9 is deposited on the entire surface of silicon substrate 1, whereby a semiconductor device having such a local interconnection structure as shown in FIG. 29 is complete.

The above described local interconnection structure of a semiconductor device has, however, the following problems.

First, in the step of patterning titanium layer 7 and titanium nitride layer 8 shown in FIGS. 33 and 34, silicide film 5 and silicide layer 3b formed on gate electrode 4 and active region 2b are similarly etched by an etchant used in etching titanium layer 7 and titanium nitride layer 8. Therefore, in order to pattern titanium layer 7 and titanium nitride layer 8 favorably on silicide film 5 and silicide layer 3b, as shown in FIG. 34, a very difficult step is required.

In order to facilitate the patterning step, titanium layer 7 and titanium nitride layer 8 must be decreased in thickness as much as possible. However, titanium layer 7 and titanium nitride layer 8 reduced in thickness cause the resistance value of the local interconnection to increase, affecting operation of the semiconductor device unfavorably.

SUMMARY OF THE INVENTION

One object of the present invention is to provide an interconnection structure of a semiconductor device having a local interconnection with a sufficiently low resistance value.

Another object of the present invention is to provide a method of manufacturing an interconnection structure of a semiconductor device which facilitates patterning of a local interconnection.

In order to achieve the above objects, an interconnection structure of a semiconductor device according to the present invention includes, in one aspect, a first conductive layer, a second conductive layer provided in the vicinity of the first conductive layer, an interlayer insulating film covering the first conductive layer and the second conductive layer and exposing a prescribed region of the first conductive layer and a prescribed region of the second conductive layer, and a metal buried layer filling the contact hole and electrically connecting the first conductive layer and the second conductive layer.

With the interconnection structure of a semiconductor device, the metal buried layer can be formed to have a thickness approximately the same as the height of the contract hole provided in the interlayer insulating film. Therefore, the resistance value of the metal buried layer is made sufficiently small, enabling a local interconnection structure with low resistance to be implemented.

In order to achieve the above objects, an interconnection structure of a semiconductor device according to the present invention includes, in another aspect, a gate electrode formed on a semiconductor substrate with an insulating film interposed therebetween and having its side face covered with a sidewall insulating film, an active region formed in the vicinity of the gate electrode with a prescribed depth from the main surface of the semiconductor substrate, an interlayer insulating film covering the gate electrode and the active region and having a contact hole exposing a prescribed region on the upper surface of the gate electrode and a prescribed region on the main surface of the active region, and a buried conductive layer filling the contact hole and electrically connecting the gate electrode and the active region.

Preferably, the interconnection structure has a nitride film on the surface of the sidewall insulating film.

With the interconnection structure of a semiconductor device, the buried conductive layer can be formed to have a thickness approximately the same as the height of the contact hole provided in the interlayer insulating film. The buried conductive layer with a sufficiently low resistance value is formed. Therefore, a local interconnection structure with low resistance can be implemented.

In order to achieve the above objects, a method of manufacturing an interconnection structure of a semiconductor device according to the present invention includes the following steps.

First, a first conductive layer is formed in a prescribed region of a semiconductor substrate. Then, a second conductive layer is formed in the vicinity of the first conductive layer in the semiconductor substrate.

A first interlayer insulating film is formed so as to cover the entire surface of the semiconductor substrate. Then, with a photolithography technique, a first contact hole exposing the first conductive layer and the second conductive layer is formed in the first interlayer insulating film.

A metal layer is deposited on the entire surface of the first interlayer insulating film. The metal layer is etched back, so that a first metal buried layer electrically connected to the first conductive layer and the second conductive layer is formed in the first contact hole.

According to the method of manufacturing an interconnection structure of a semiconductor device, the surface of the first conductive layer and the surface of the second conductive layer are not etched when the interlayer insulating film is etched to form the contact hole. Therefore, the contact hole can be formed easily. Further, when the first metal buried layer is etched, the interlayer insulating film is not etched by an etchant used for etching the metal layer. Therefore, the first metal buried layer can be etched easily.

Preferably, the method further includes the step of forming a third conductive layer in a prescribed region on the semiconductor substrate. The step of forming the first contact hole includes the step of forming a second contact hole exposing the third conductive layer in the first interlayer insulating film. The step of forming the first metal buried layer includes the step of forming a second metal buried layer electrically connecting to the third conductive layer in the second contact hole.

As described above, by using the local interconnection structure in which the first metal buried layer is formed in the first contact hole, formation of the second contact hole and the second metal buried layer in another region can be simultaneously conducted, making it possible to decrease the number of manufacturing steps of the semiconductor device to half.

More preferably, the step of forming the second metal buried layer includes the step of forming an interconnection layer connecting to the second metal buried layer on the first interlayer insulating film at the etchback of the second metal layer.

As a result, the second metal layer and the interconnection layer are formed simultaneously, enabling the number of manufacturing steps of a semiconductor device to be decreased.

More preferably, the method further includes the step of forming a second interlayer insulating film on the first interlayer insulating film, the step of forming a third contact hole connecting to the second contact hole in the second interlayer insulating film with a photolithography technique, and the step of forming a first electrode electrically connected to the second metal buried layer in the third contact hole.

According to the method, the first electrode is directly formed in the second metal buried layer. Therefore, the interconnection structure in the contact hole can be simplified.

More preferably, the method further includes the step of forming a third metal buried layer in the third contact hole between the step of forming the second metal buried layer and the step of forming the first electrode.

Accordingly, the third metal buried layer is formed in the third contact hole. Therefore, even if the second interlayer insulating film has a relatively large thickness, the first and third contact holes formed in two stages can substantially reduce the aspect ratio in each contact hole.

Further, the first electrode can be formed above the local interconnection. Miniaturization of the semiconductor device can be further improved.

More preferably, the method further includes the following steps.

A fourth conductive layer is formed in a prescribed region of the semiconductor substrate. At the time of formation of the first contact hole, a fourth contact hole exposing the fourth conductive layer is formed in the first interlayer insulating film. At the time of formation of the first metal buried layer, a fourth metal buried layer electrically connecting to the fourth conductive layer is formed. The surface of the first interlayer insulating film is flattened with a chemical and mechanical polishing method. A second interlayer insulating film is formed on the first interlayer insulating film. A third contact hole connecting to the second contact hole and a fifth contact hole connecting to the fourth contact hole are formed in the second interlayer insulating film with a photolithography technique. A first electrode electrically connected to the second metal buried layer is formed in the third contact hole, and a second electrode electrically connected to the fourth metal buried layer is formed in the fifth contact hole.

As a result, the flattened surface of the first interlayer insulating film allows the third contact hole and the fifth contact hole to have the same aspect ratio. Accordingly, the first and second electrodes formed in the third and fifth contact holes can be patterned under the same condition.

More preferably, the step of forming the second metal buried layer includes the step of patterning the second metal layer so that the upper surface of the second metal layer is higher than the surface of the first interlayer oxide film.

As a result, the aspect ratio of the contact hole formed above the second contact hole can be reduced.

More preferably, the step of forming the first conductive layer includes the step of forming a gate electrode of a prescribed shape on the semiconductor substrate with a gate oxide film interposed therebetween, the step of forming a sidewall insulating film on the sidewall of the gate electrode, and the step of forming a nitride film on the sidewall insulating film.

As a result, even if the first interlayer insulating film and the sidewall insulating film are formed of the same material, the sidewall insulating film is not etched at the time of formation of the first contact hole.

The foregoing and other objects, features, aspects and advantages of the present invention will become more apparent from the following detailed description of the

Figure 1:
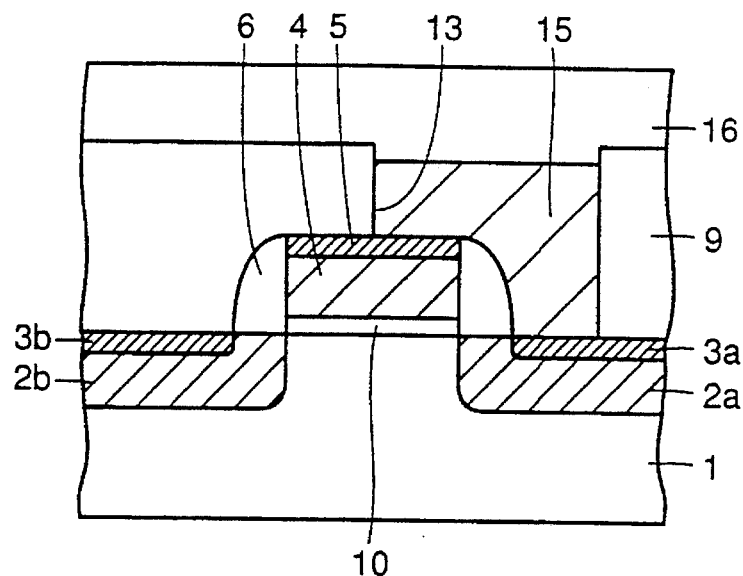
FIG. 1 is a first sectional view showing an interconnection structure of a semiconductor device according to a first embodiment of the present invention.

DESCRIPTION OF THE PREFERRED EMBODIMENTS (First Embodiment)

Description will now be given of an interconnection structure of a semiconductor device according to the first embodiment of the present invention with reference to FIG. 1.

Gate electrode 4 is formed on the main surface of silicon substrate 1 with gate oxide film 10 interposed therebetween. Silicide film 5 for reducing the resistance of gate electrode 4 is formed on gate electrode 4. The sidewall of gate electrode 4 and silicide film 5 is covered with sidewall oxide film 6.

First active regions 2a, 2b forming a source/drain region are formed a predetermined depth from the main surface of silicon substrate 1. Silicide layers 3a, 3b for reducing the resistance of first active regions 2a, 2b are formed on the main surfaces of first active regions 2a, 2b.

The upper surfaces of gate electrode 4 and first active regions 2a, 2b are covered with first interlayer oxide film 9. A first contact hole 13 exposing a prescribed region of gate electrode 4 and a prescribed region of first active region 2a is formed in first interlayer oxide film 9. First buried layer 15 of a metal layer such as tungsten for electrically connecting gate electrode 4 and first active region 2a is formed in first contact hole 13. The upper surface of first interlayer oxide film 9 and the upper surface of first buried layer 15 are covered with a second interlayer oxide film 16.

With the above local interconnection structure, first buried layer 15 is provided in first contact hole 13 with a thickness approximately the same as the height of first contact hole 13. Therefore, the resistance of first buried layer 15 can be substantially reduced, and a low resistance local interconnection structure can be implemented with miniaturization of the device maintained.

A method of manufacturing the above local interconnection structure will now be described with reference to FIGS. 2 to 4.

Figure 2:
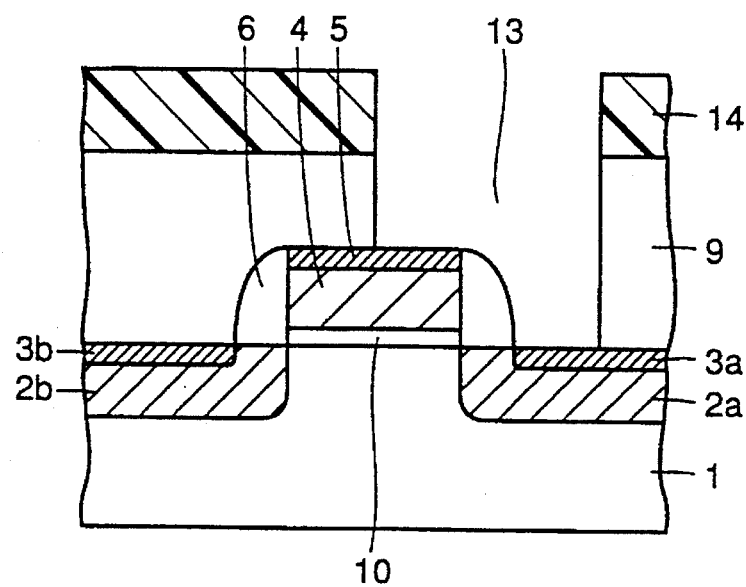
FIGS. 2 to 4 are sectional views showing the first to third steps of a method of manufacturing the interconnection structure of a semiconductor device according to the first embodiment of the present invention.

Referring to FIG. 2, gate electrode 4 and the like are formed on semiconductor substrate 1 by the same steps as those shown in FIGS. 29 to 32, which were described with reference to the conventional art. Then, first interlayer oxide film 9 is deposited a prescribed thickness on the entire surface of silicon substrate 1. Then, a resist film 14 having a prescribed pattern is formed on the surface of first interlayer oxide film 9 with a photolithography technique. With resist film 14 used as a mask, contact hole 13 exposing a prescribed region of gate electrode 4 and a prescribed region of first active region 2a is formed.

Figure 3:
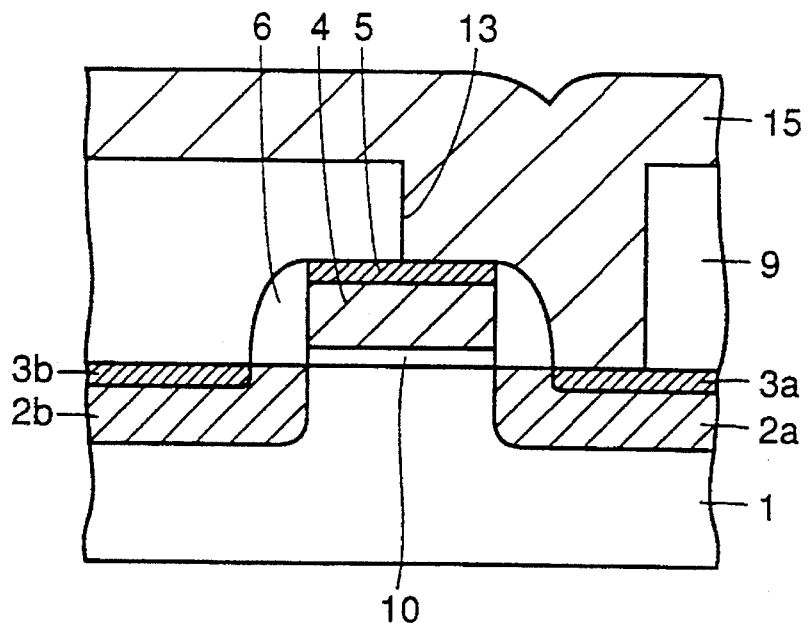
Figure 4:
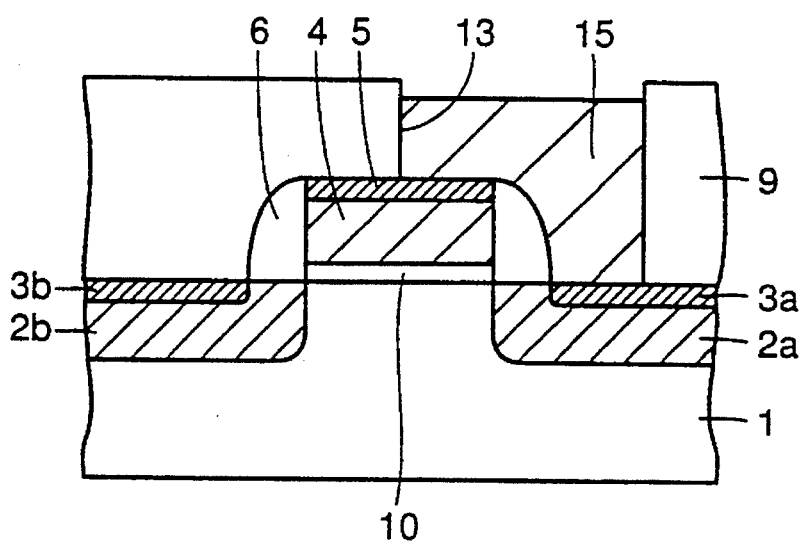

Then, referring to FIG. 3, metal layer 15 of tungsten or the like is deposited a prescribed thickness on the entire surface of silicon substrate 1 with a CVD method. Referring to FIG. 4, by etching back metal layer 15, first buried layer 15 is formed in contact hole 13. Then, second interlayer oxide film 16 is deposited on the entire surface of silicon substrate 1, so that the interconnection structure of a semiconductor device shown in FIG. 1 is complete.

According to the above manufacturing method, when contact hole 13 is formed in first interlayer oxide film 9, silicide film 5 and silicide layer 3a are not etched. Therefore, contact hole 13 is formed easily. In the step of etching back first buried layer 15, interlayer oxide film 9 is not etched by an etchant used for etching metal layer 15. Therefore, first buried layer 15 can be etched back easily.

Note that first buried layer 15 of tungsten is formed in contact hole 13 in this embodiment. However, the present invention is not limited thereto. The same effect can be obtained by depositing in advance titanium, titanium nitride or the like in contact hole 13 by sputtering, and then forming first buried layer 15.

Figure 5:
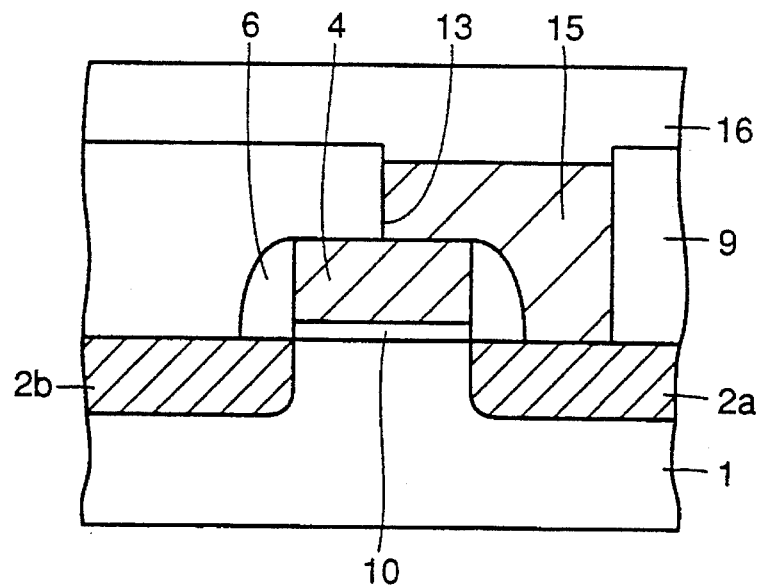
FIG. 5 is a second sectional view showing the interconnection structure of a semiconductor device according to the first embodiment of the present invention.

Further, although silicide film 5 and silicide layers 3a, 3b are provided to reduce the resistance of gate electrode 4 and first active regions 2a, 2b in FIG. 1, the same effect can be obtained in a semiconductor device in which silicide is not formed at the surfaces of gate electrode 4 and first active regions 2a, 2b, as shown in FIG. 5.

Further, in this embodiment, first buried layer 15 is formed by depositing a metal layer of tungsten or the like by a CVD method. However, the present invention is not limited thereto. First buried layer 15 can be formed by selective growth of tungsten, for example.

(Second Embodiment)

Figure 6:
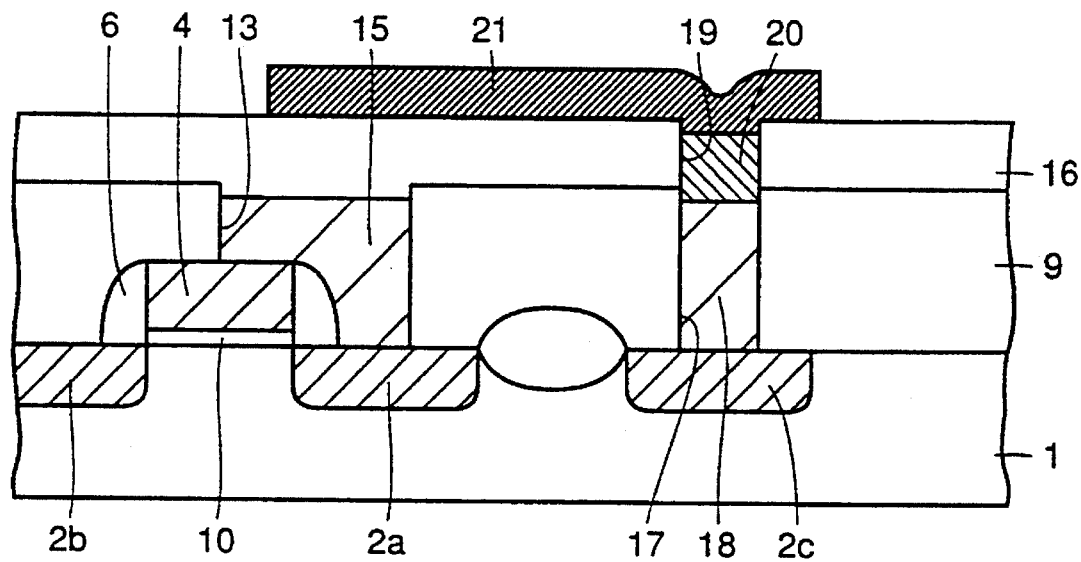
FIG. 6 is a first sectional view showing an interconnection structure of a semiconductor device according to a second embodiment of the present invention.

The second embodiment of the present invention will now be described with reference to FIG. 6. In the second embodiment, an ordinary interconnection structure is formed in another region of the surface of silicon substrate 1 in addition to the local interconnection structure shown in the first embodiment. Therefore, in addition to the local interconnection structure shown in FIG. 1, a second active region 2c, a second contact hole 17 exposing second active region 2c and a third contact hole 19, a second buried layer 18 formed in second contact hole 17, and a third buried layer 20 provided in third contact hole 19 are formed on the surface of silicon substrate 1. Further, a first aluminum interconnection layer 21 connected to third buried layer 20 is provided on second interlayer insulating film 16.

Figure 7:
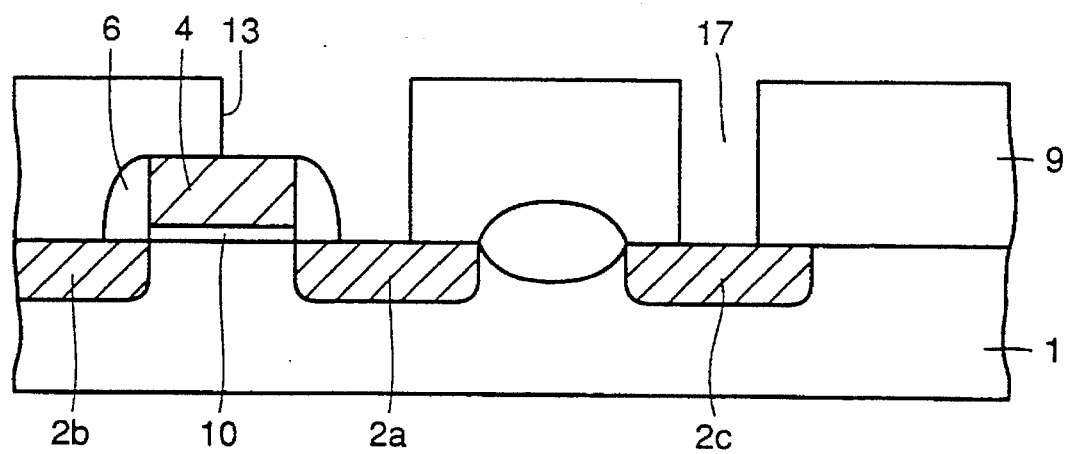
FIGS. 7 to 9 are sectional views showing the first to third steps of a method of manufacturing the interconnection structure of a semiconductor device according to the second embodiment of the present invention.

Description will now be given of the steps of manufacturing a semiconductor device structured as described above with reference to FIGS. 7 to 9. Referring to FIG. 7, first interlayer insulating film 9 is deposited on silicon substrate 1, and contact hole 13 exposing gate electrode 4 and first active region 2a and contact hole 17 exposing second active region 2c are simultaneously formed.

Figure 8:
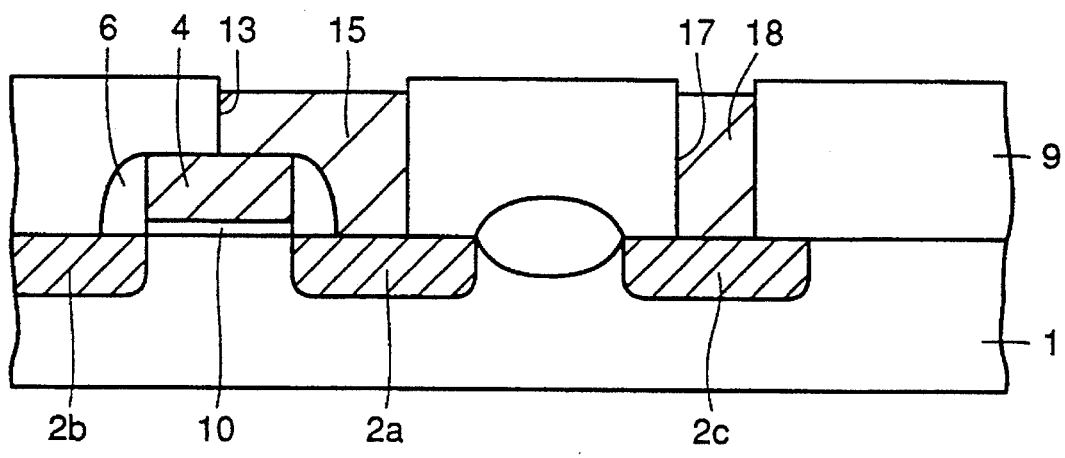

Then, referring to FIG. 8, a metal layer of tungsten or the like is deposited on first interlayer oxide film 9 with a CVD method, for example. By etching back the layer, first buried layer 15 and second buried layer 18 are simultaneously formed in first contact hole 13 and second contact hole 17, respectively.

Figure 9:
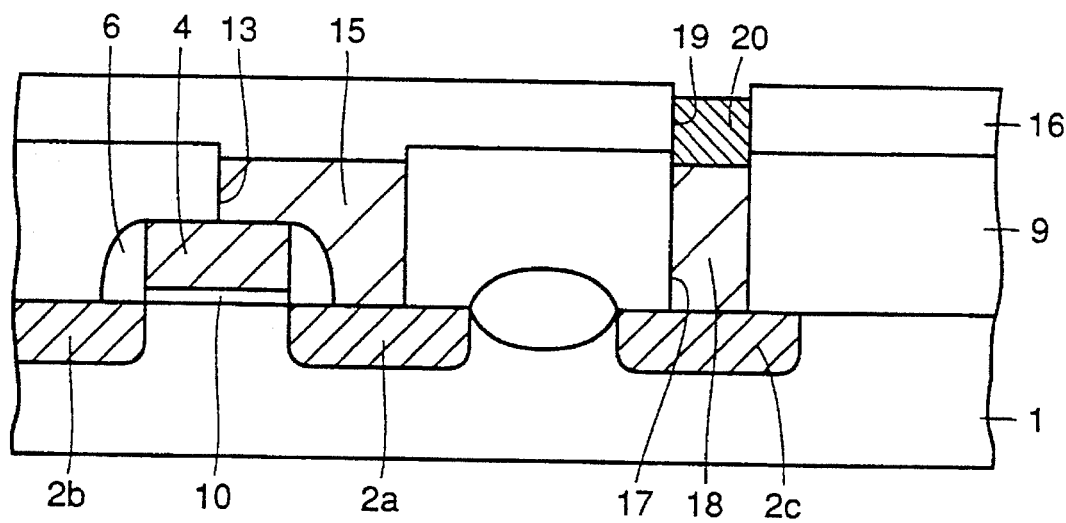
Figure 16:
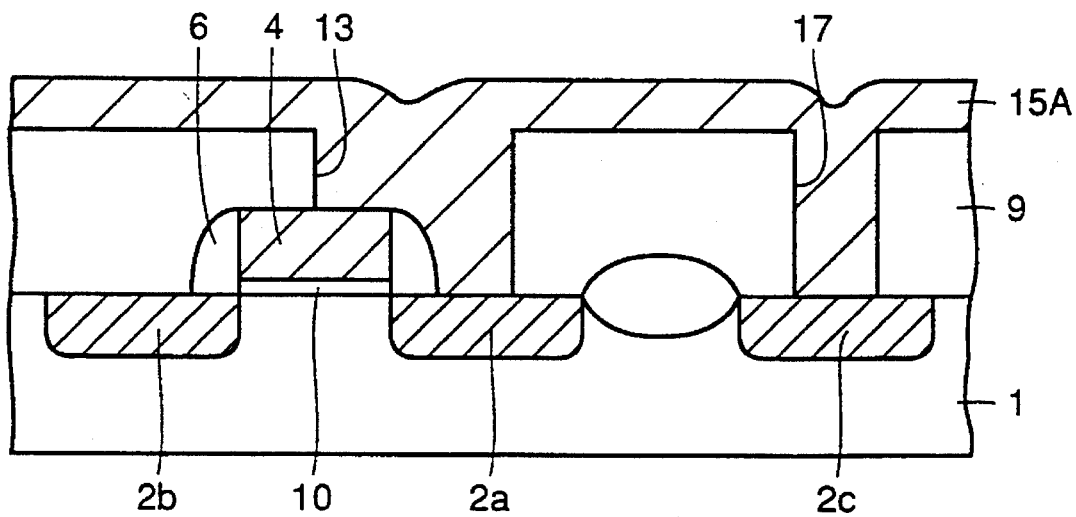
Figure 17:
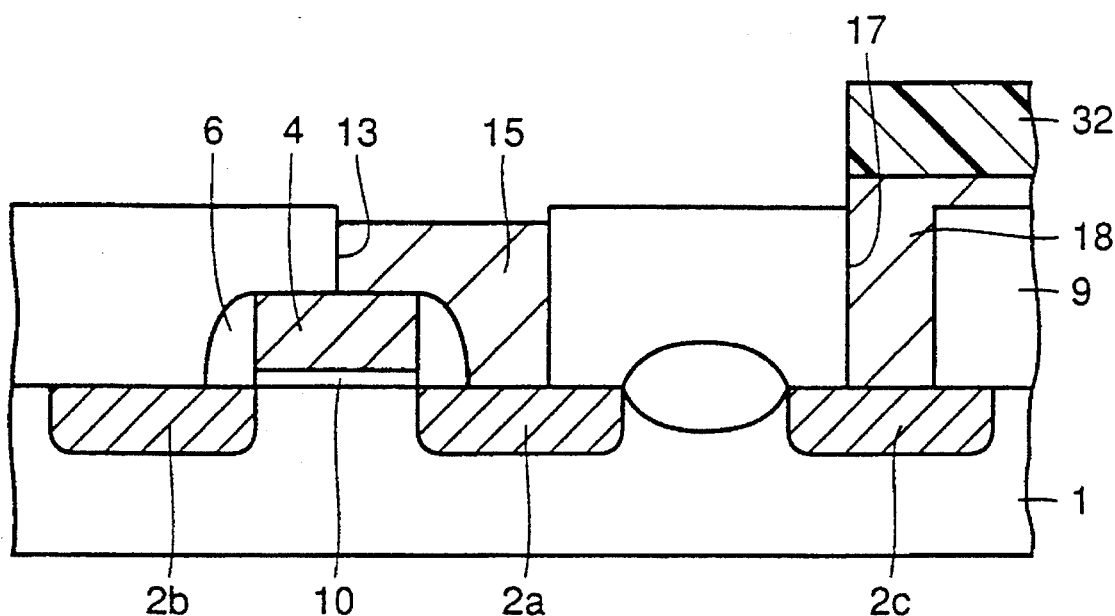
Figure 18:
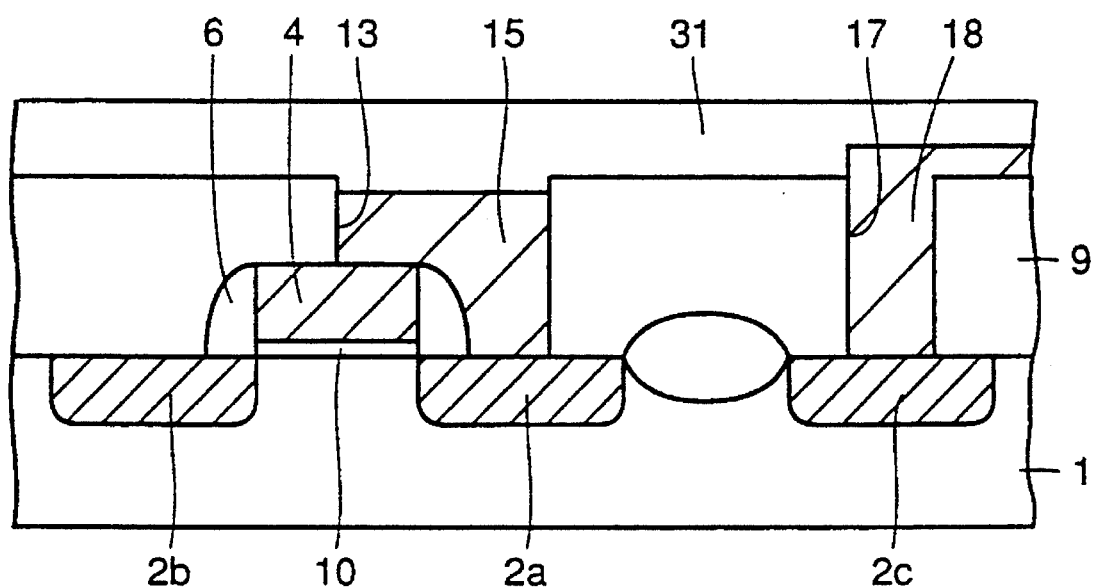

Referring to FIG. 9, after depositing second interlayer oxide film 16 on the entire surface of first interlayer oxide film 9, third contact hole 19 connecting to second contact hole 17 is formed in second interlayer oxide film 16. After that, a metal layer of tungsten or the like is again deposited on second interlayer oxide film 16 with a CVD method. By etching back the metal layer, third buried layer 20 is formed in third contact hole 19. Then, by depositing an aluminum interconnection layer on second interlayer oxide film 16 and patterning the same into a prescribed configuration, a semiconductor device shown in FIG. 16 is complete.

As described above, according to the second embodiment, by using the local interconnection structure shown in the first embodiment, an interconnection layer in another region can be formed simultaneously. As a result, the number of the manufacturing steps of a semiconductor device can be reduced to half.

Figure 10:
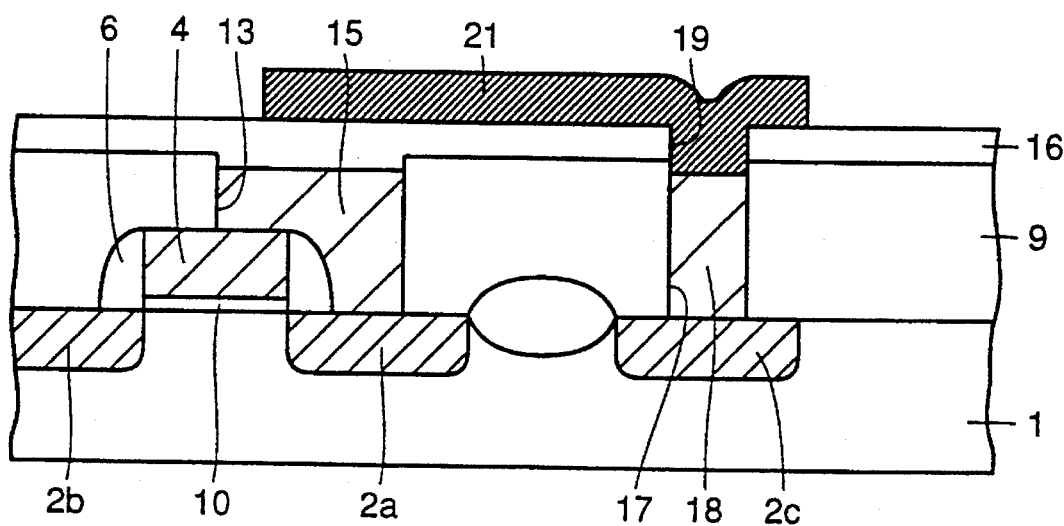
FIG. 10 is a second sectional view showing the interconnection structure of a semiconductor device according to the second embodiment of the present invention.

In the above second embodiment, third buried layer 20 is formed in third contact hole 19. However, if second interlayer insulating film 16 can be formed to have a small thickness, first aluminum interconnection layer 21 may be provided directly on second interlayer oxide film 16 as shown in FIG. 10, because the aspect ratio of third contact hole 16 becomes small.

(Third Embodiment)

Figure 11:
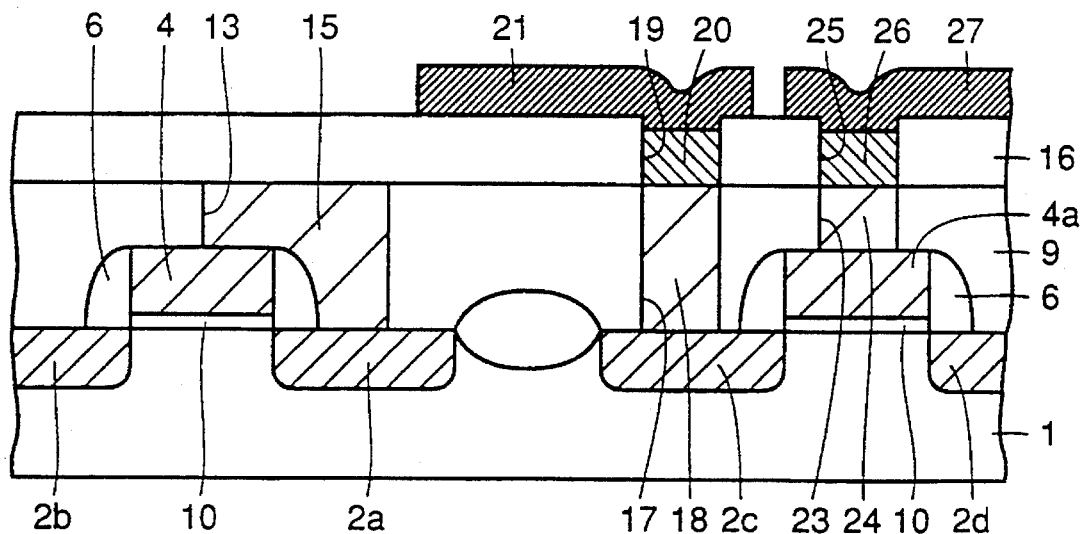
FIG. 11 is a sectional view showing an interconnection structure of a semiconductor device according to a third embodiment of the present invention.

The third embodiment according to the present invention will now be described with reference to FIG. 11. In the third embodiment, an interconnection structure connecting to another gate electrode is provided in addition to the structure shown in the above second embodiment. A gate electrode 4a is formed in still another region on silicon substrate 1 with gate oxide film 10 interposed therebetween. The upper surface of gate electrode 4a is covered with first interlayer oxide film 9. A fourth contact hole 23 is formed in first interlayer oxide film 9, and a fourth buried layer 24 is formed in fourth contact hole 23. Further, a fifth contact hole 25 connecting to fourth contact hole 23 is formed in second interlayer oxide film 16, and a fifth buried layer 26 is provided in fifth contact hole 25. A second aluminum interconnection layer 27 is formed on fifth buried layer 26.

Figure 12:
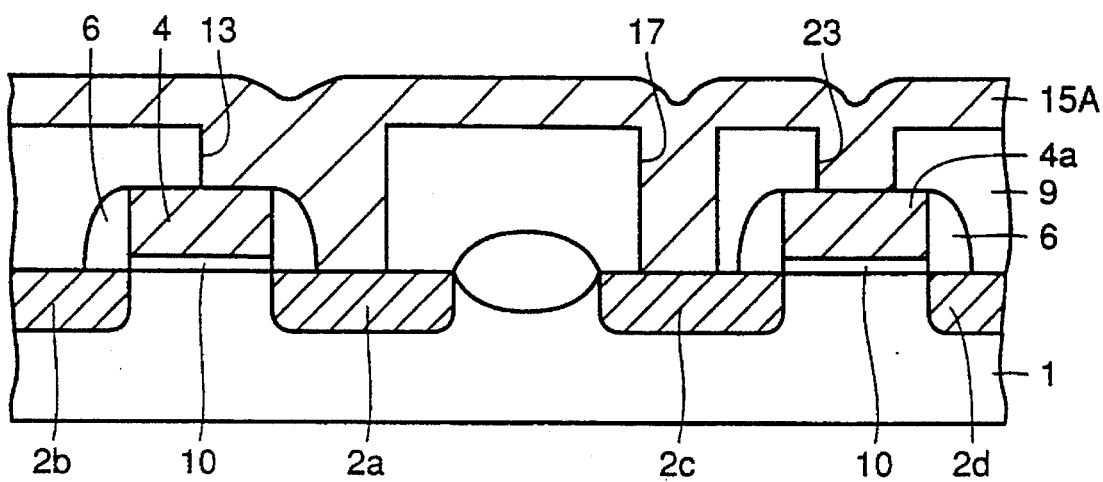
FIGS. 12 and 13 are sectional views showing the first and second steps of a method of manufacturing the interconnection structure of a semiconductor device according to the third embodiment of the present invention.

A method of manufacturing a semiconductor device structured as described above will now be described with reference to FIGS. 12 and 13.

After depositing first interlayer oxide film 9 so as to cover gate electrodes 4, 4a, first contact hole 13, second contact hole 17, and fourth contact hole 23 are simultaneously formed with a photolithography technique. Then, as shown in FIG. 12, a metal layer 15A of tungsten or the like is deposited a prescribed thickness on the entire surface of first interlayer oxide film 9 with a CVD method or the like.

Figure 13:
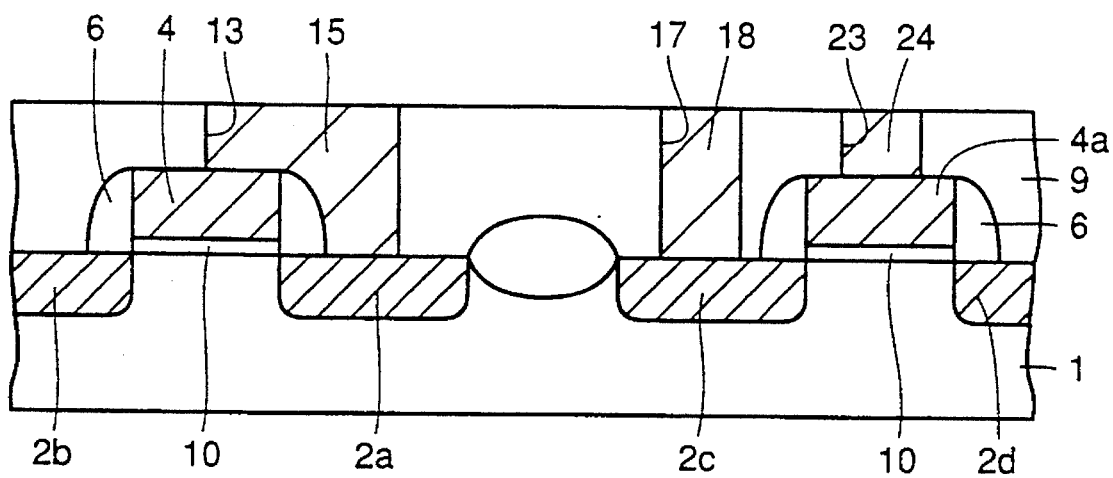

Referring to FIG. 13, the surface of conductive layer 15A and first interlayer oxide film 9 is flattened with a chemical and mechanical polishing method, so that first buried layer 15, second buried layer 18, and fourth buried layer 24 are formed in first contact hole 13, second contact hole 17, and fourth contact hole 23, respectively. Since the surface is flattened with a chemical and mechanical polishing method, the surface of first interlayer oxide film 9 is flush with the surfaces of first buried layer 15, second buried layer 18, and fourth buried layer 24. By carrying out the same steps as those shown in FIGS. 9 and 10, which were described in the second embodiment, fifth contact hole 25 is formed on fourth contact hole 23, and fifth buried layer 26 is formed in fifth contact hole 25. Further, a second aluminum interconnection layer 27 connecting to fifth buried layer 26 is formed.

As described above, in this embodiment, after forming conductive layer 15A for forming first buried layer 15, second buried layer 18, and fourth buried layer 24, the surface is flattened with a chemical and mechanical polishing method. Therefore, third contact hole 19 and fifth contact hole 25 formed on second buried layer 18 and fourth buried layer 24 have the same aspect ratio, enabling formation of third buried layer 20 and fifth buried layer 26 under the same condition.

(Fourth Embodiment)

Figure 14:
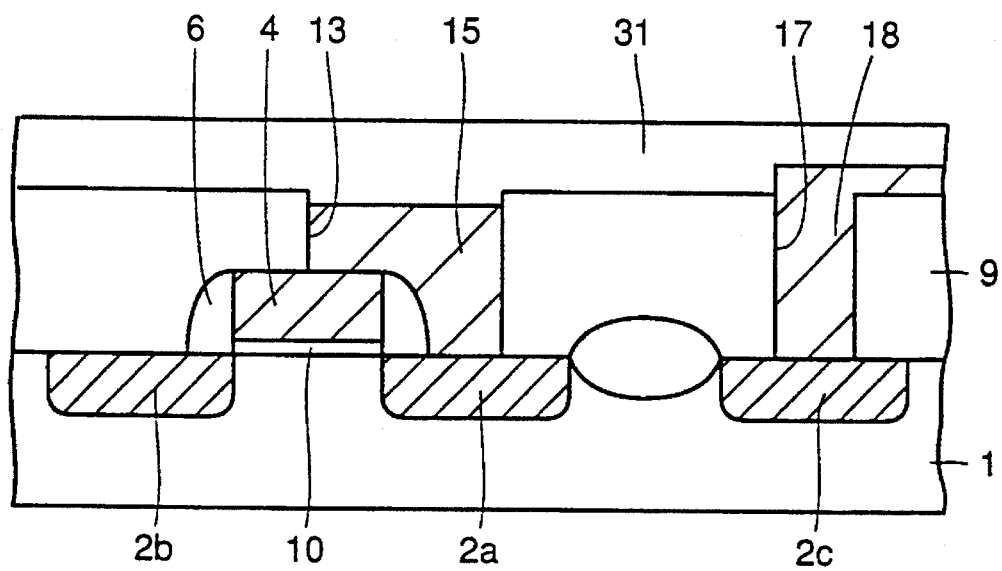
FIG. 14 is a sectional view showing an interconnection structure of a semiconductor device according to a fourth embodiment of the present invention.

The fourth embodiment of the present invention will now be described with reference to FIG. 14. In the fourth embodiment, second buried layer 18 having an interconnection pattern structure is formed on first interlayer oxide film 9 in another region, in addition to the local interconnection structure shown in the first embodiment.

Figure 15:
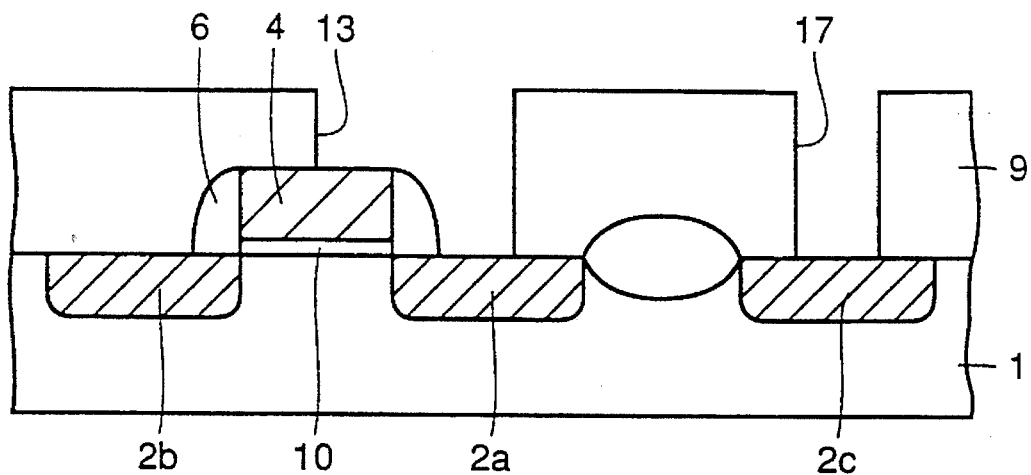
FIGS. 15 to 18 are sectional views showing the first to fourth steps of a method of manufacturing the interconnection structure of a semiconductor device according to the fourth embodiment of the present invention.

A method of manufacturing a semiconductor device thus structured will be described with reference to FIGS. 15 to 18. Referring to FIG. 15, after depositing first interlayer oxide film 9 on silicon substrate 1, first contact hole 13 and second contact hole 17 are formed at prescribed positions with a photolithography technique.

Then, referring to FIG. 16, conductive layer 15A of tungsten or the like is deposited on the entire surface of first interlayer oxide film 9 with a CVD method, for example. Then, referring to FIG. 17, a resist film 32 having a prescribed pattern configuration is formed on conductive layer 15A. After that, with resist film 32 used as a mask, conductive layer 15A is patterned. As a result, first buried layer 15 is formed in first contact hole 13, and second buried layer 18 having a prescribed pattern configuration is formed in second contact hole 17 and on first interlayer oxide film 9. Then, referring to FIG. 18, second interlayer oxide film 16 is deposited on the entire surface of first interlayer oxide film 9, so that a semiconductor device structured as shown in FIG. 14 is complete.

According to this embodiment, a prescribed interconnection pattern is formed on first interlayer oxide film 9 at the time of formation of first buried layer 15 and second buried layer 18. The process of manufacturing the semiconductor device can be shortened.

(Fifth Embodiment)

Figure 19:
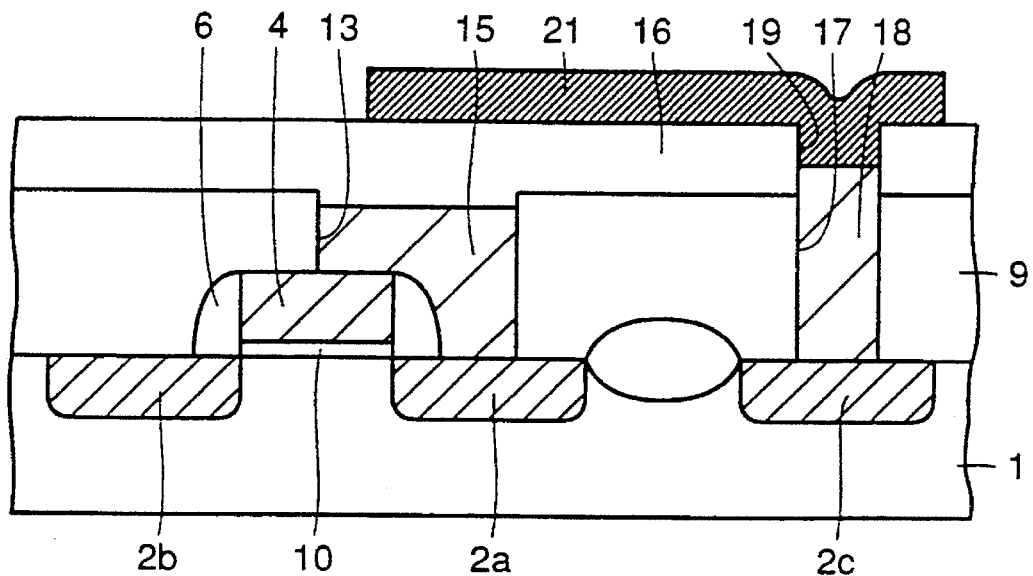
FIG. 19 is a sectional view showing an interconnection structure of a semiconductor device according to a fifth embodiment of the present invention.

The fifth embodiment of the present invention will be described hereinafter with reference to FIG. 19. In the fifth embodiment, the surface of second buried layer 18 of the semiconductor device shown in FIG. 10 is higher than the surface of first interlayer oxide film 9, and extends into third contact hole 19. By thus structured, the actual aspect ratio of third contact hole 19 becomes small. Even if second interlayer oxide film 16 has a large thickness, first aluminum interconnection layer 21 can be formed directly on second buried layer 18.

A method of manufacturing a semiconductor device structured as described above will now be described with reference to FIGS. 20 to 22.

Figure 20:
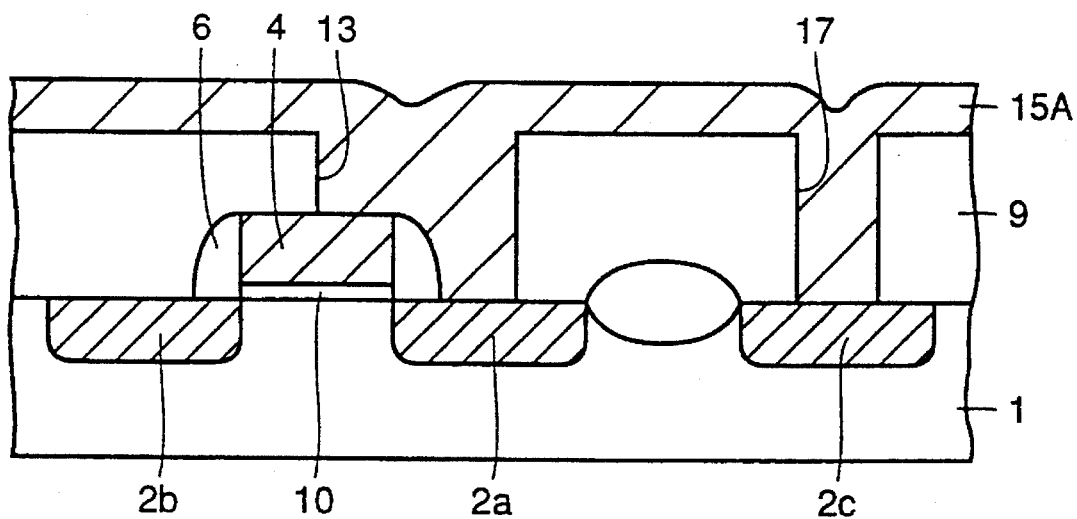
FIGS. 20 to 22 are sectional views showing the first to third steps of a method of manufacturing the interconnection structure of a semiconductor device according to the fifth embodiment of the present invention.

Referring to FIG. 20, first contact hole 13 and second contact hole 17 are formed at prescribed positions in first interlayer oxide film 9. Then, conductive layer 15A of tungsten or the like is formed on first interlayer oxide film 9 with a CVD method.

Figure 21:
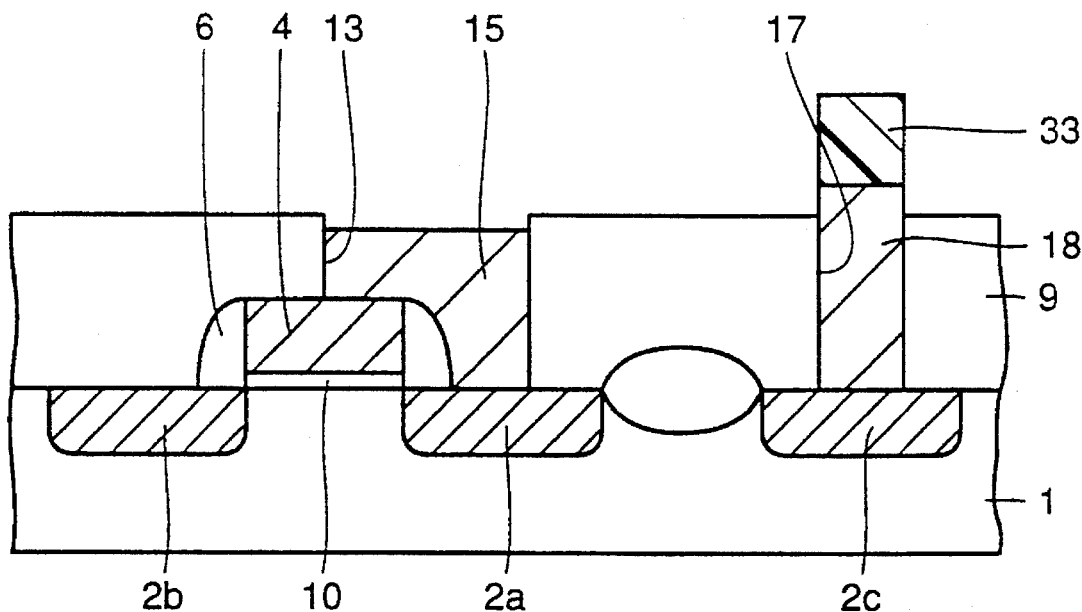
Figure 22:
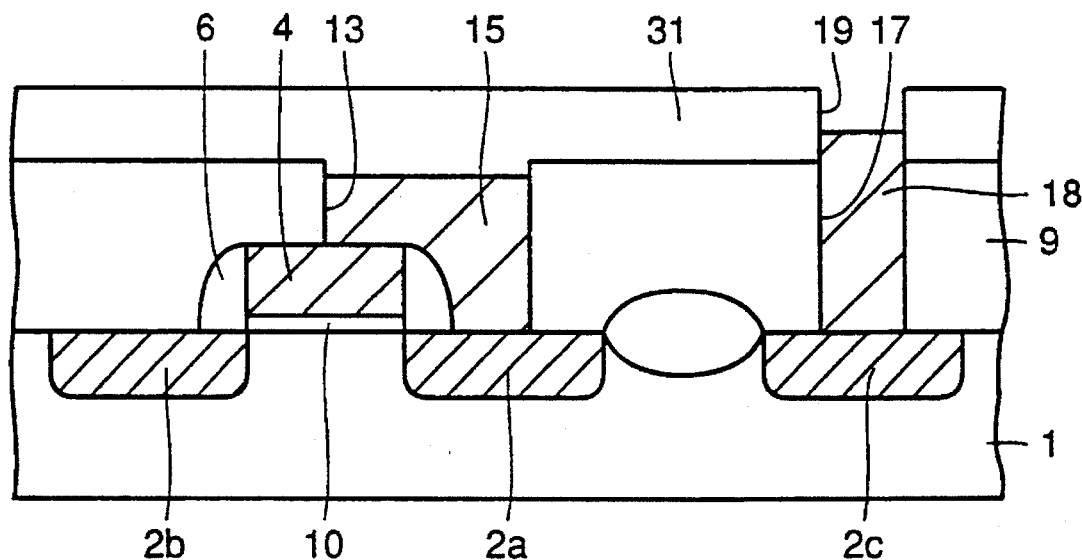

Then, referring to FIG. 21, a resist film 33 is left only on second contact hole 17. With resist film 33 used as a mask, conductive layer 15A is etched. As a result, first buried layer 15 is formed in first contact hole 13, and second buried layer 18 higher than the surface of first interlayer oxide film 9 is formed in second contact hole 17. Then, referring to FIG. 22, after removing resist film 33, second interlayer oxide film 16 is formed on first interlayer oxide film 9. After that, third contact hole 19 connecting to second contact hole 17 is formed, and first aluminum interconnection layer 21 is formed in third contact hole 19 similar to the second embodiment. As a result, a semiconductor device shown in FIG. 19 is complete.

As described above, according to this embodiment, the actual aspect ratio of the third contact hole becomes small, enabling formation of first aluminum interconnection layer 21 directly on second buried layer 18.

(Sixth Embodiment)

Figure 23:
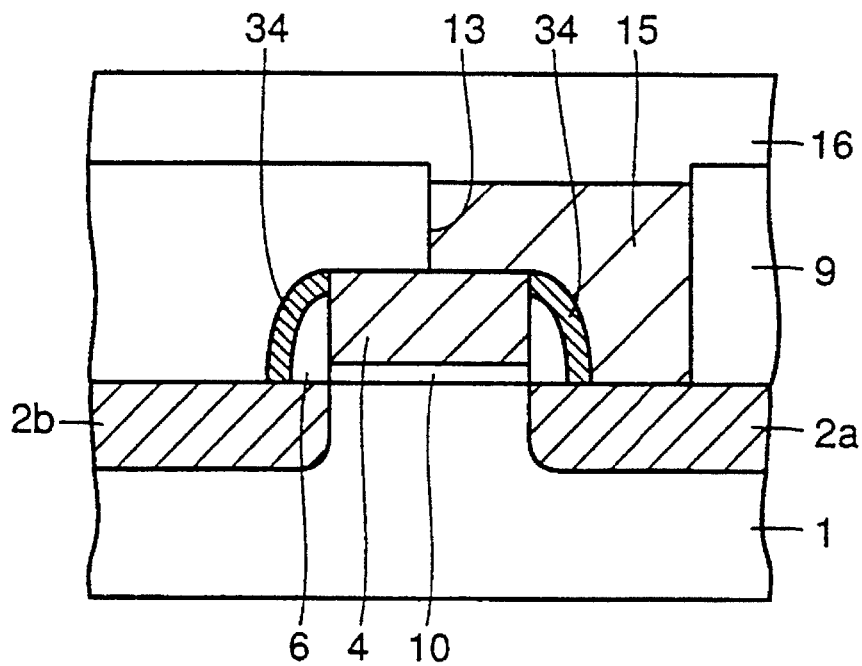
FIG. 23 is a sectional view showing an interconnection structure of a semiconductor device according to a sixth embodiment of the present invention.

The sixth embodiment of the present invention will now be described with reference to FIG. 23. In the sixth embodiment, a nitride film 34 is provided on sidewall insulating film 6 in the local interconnection structure described in the first embodiment. As a result, even if sidewall insulating film 6 and first interlayer oxide film 9 are formed of the same material, sidewall insulating film 6 is not etched at the time of formation of contact hole 13 in first interlayer oxide film 9.

A method of manufacturing the above described local interconnection structure will be described with reference to FIGS. 24 to 26.

Figure 24:
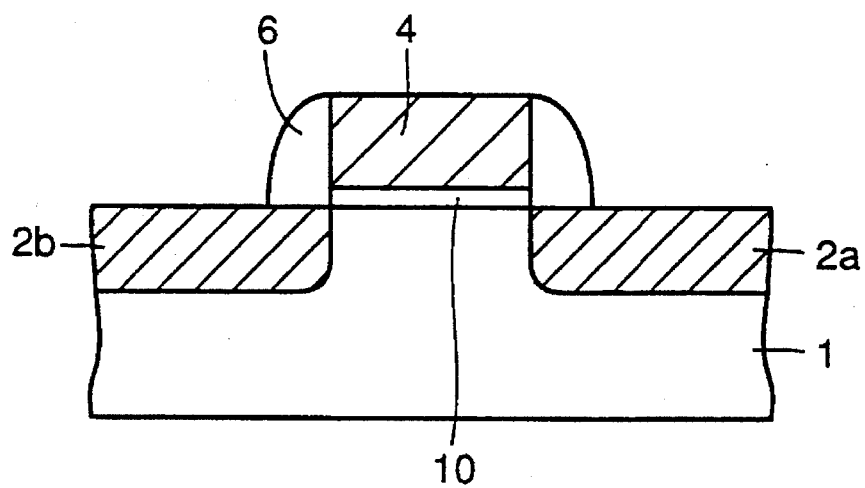
FIGS. 24 to 26 are sectional views showing the first to third steps of a method of manufacturing the interconnection structure of a semiconductor device according to the sixth embodiment of the present invention.
Figure 30:
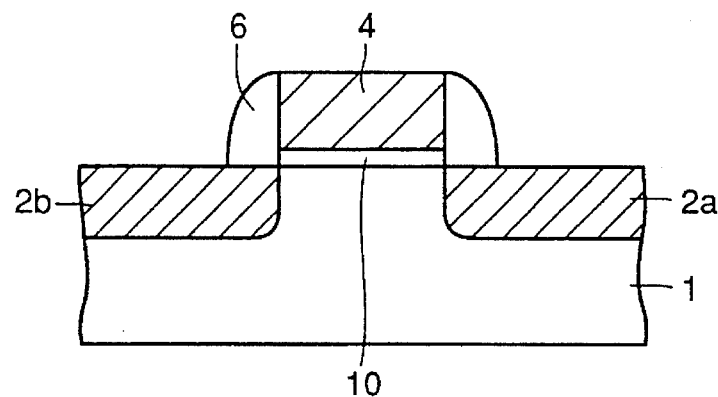
Figure 31:
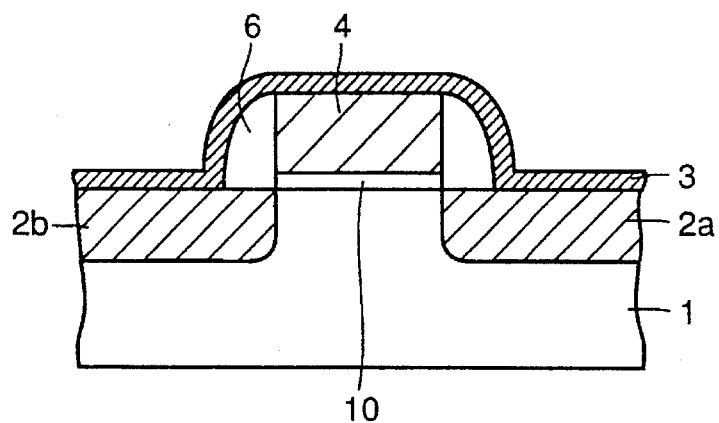
Figure 32:
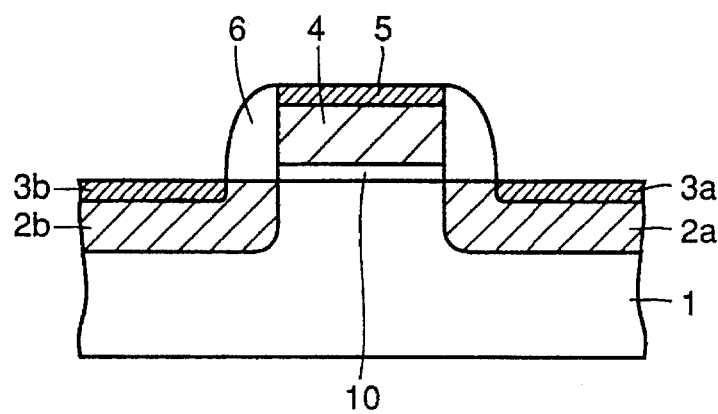
Figure 33:
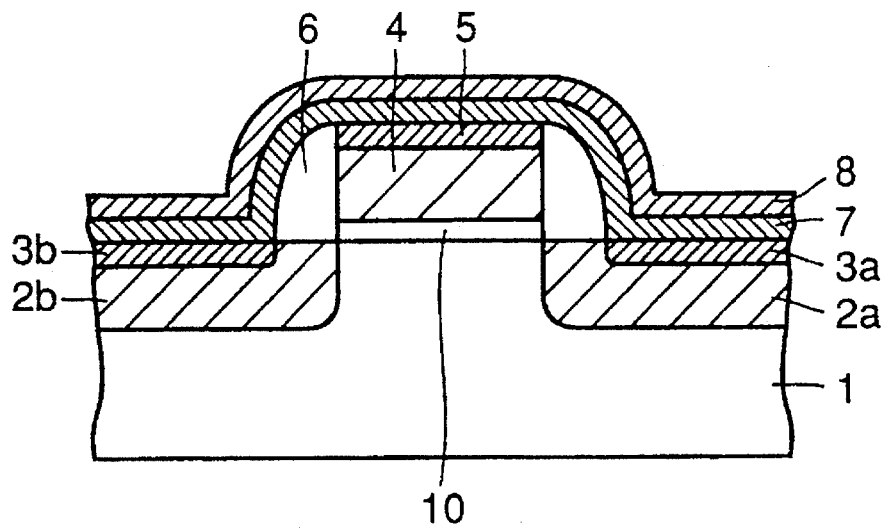
Figure 34:
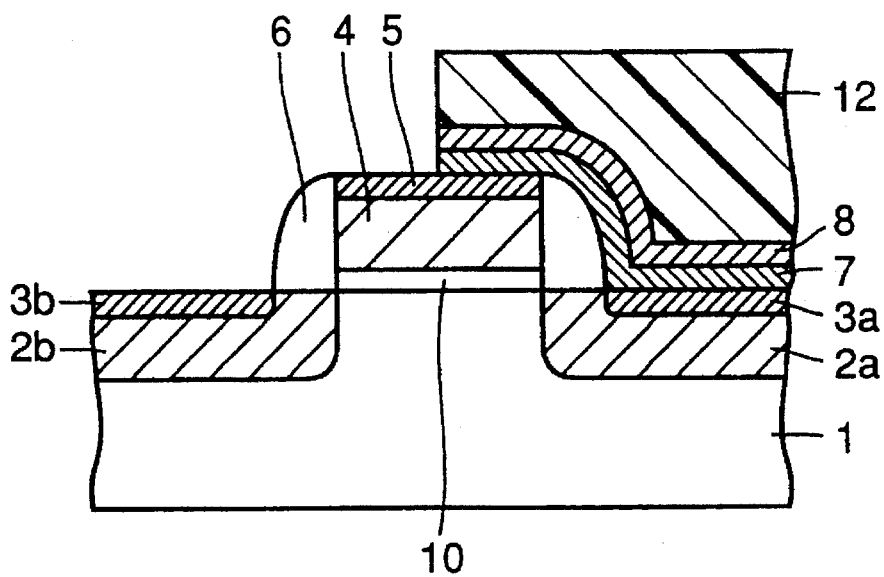

Referring to FIG. 24, gate electrode 4 and sidewall insulating film 6 are formed on silicon substrate 1 with a similar technique to the conventional technique described with reference to FIGS. 30 and 31.

Figure 25:
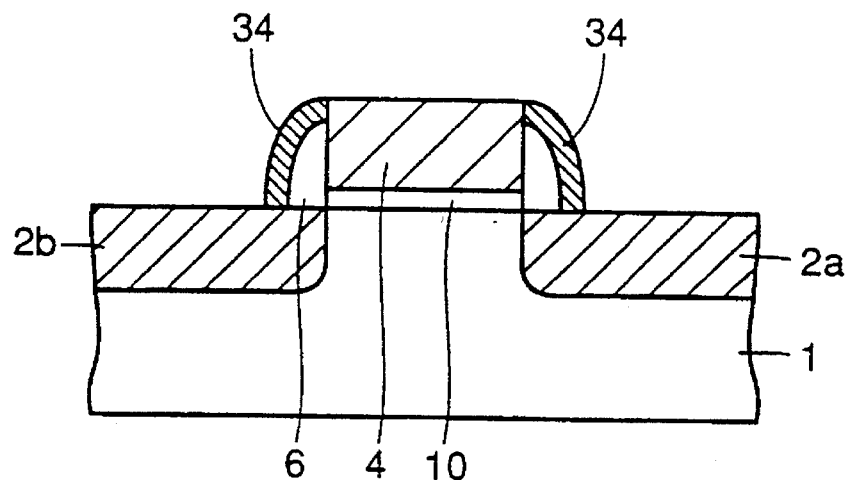

Then, referring to FIG. 25, nitride film 34 is formed on sidewall insulating film 6. Nitride film 34 may be formed, in the state shown in FIG. 24, by depositing a silicon nitride film on the entire surface of silicon substrate 1, and anisotropically etching the silicon nitride film to pattern the same, by forming SiON at the surface of sidewall insulating film 6 with an RTA method, or by directly introducing nitrogen into the surface of sidewall insulating film 6 to form SiON at the surface.

Figure 26:
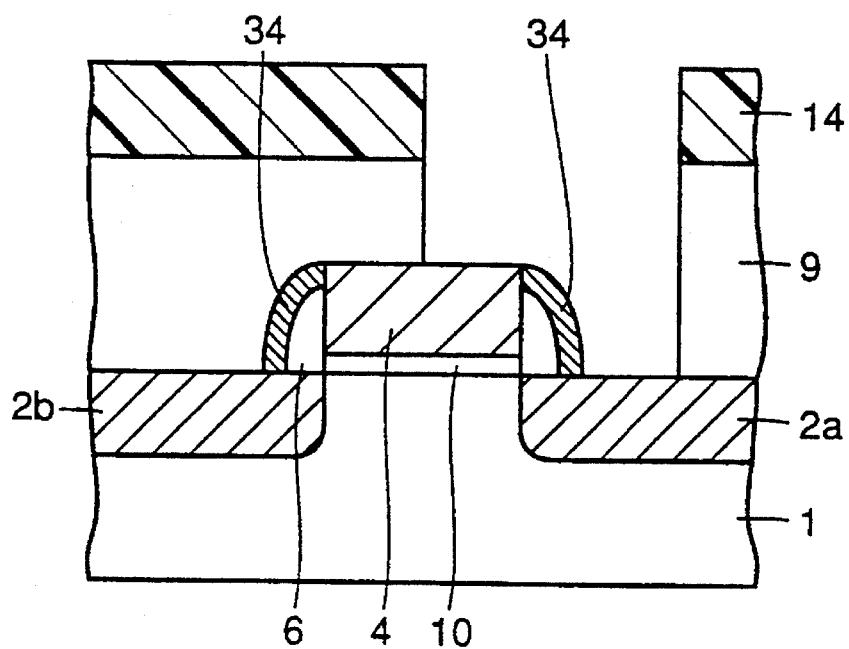

Then, referring to FIG. 26, first interlayer oxide film 9 is formed on silicon substrate 1. Similar to the case of the first embodiment, resist film 14 having a prescribed pattern configuration is formed on first interlayer oxide film 9. With resist film 14 used as a mask, first interlayer oxide film 9 is etched. At the time, even if sidewall insulating film 6 and first interlayer oxide film 9 are formed of the same material, nitride film 34 formed on the surface of sidewall insulating film 6 prevents sidewall insulating film 6 from being etched. Then, by carrying out the same steps as those of the first embodiment, a semiconductor device shown in FIG. 23 is complete.

Figure 27:
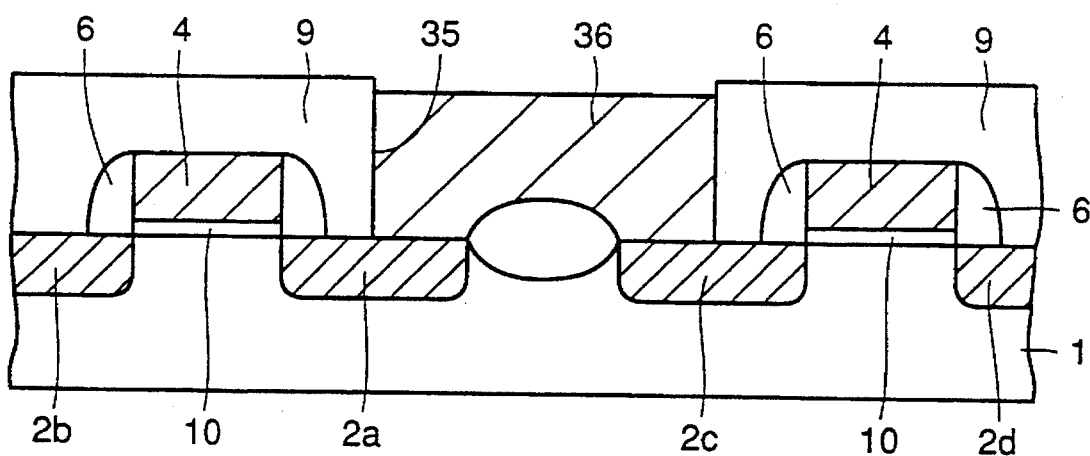
FIG. 27 is a sectional view showing another interconnection structure of a semiconductor device according to the present invention.
Figure 28:
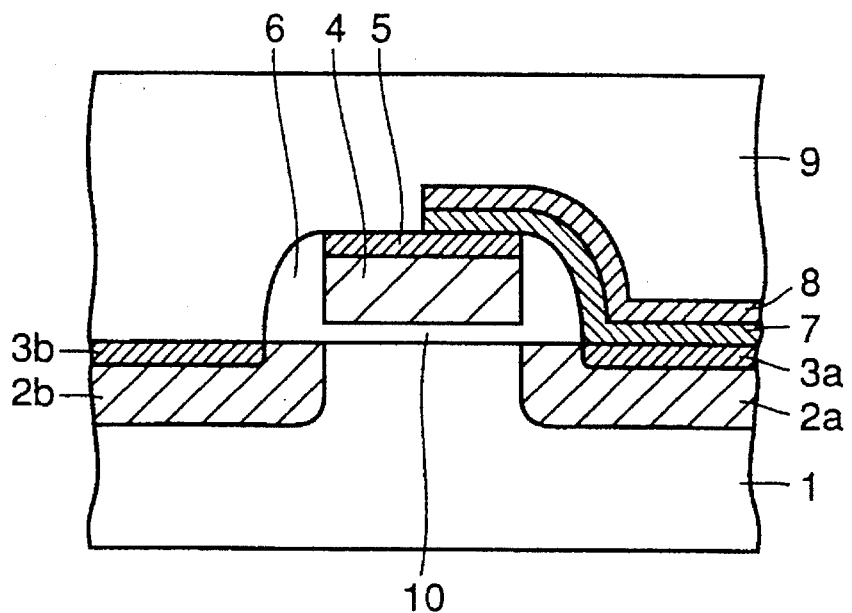
FIG. 28 is a sectional view showing a conventional interconnection structure of a semiconductor device.
Figure 29:
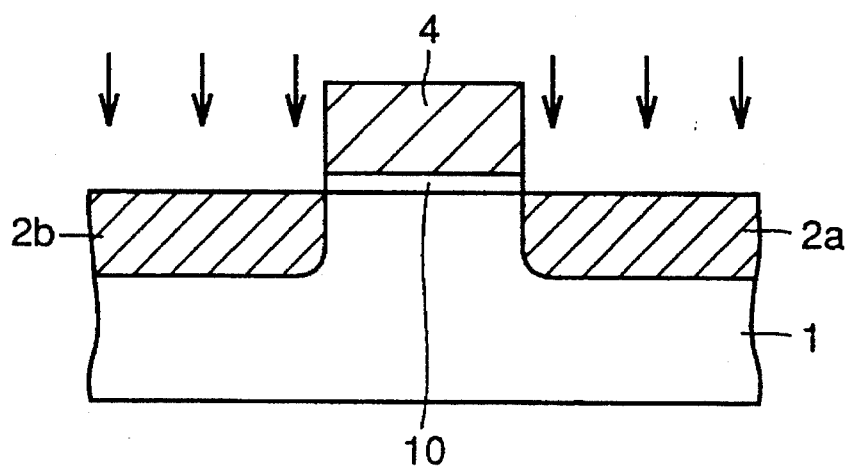
FIGS. 29 to 34 are sectional views showing the first to sixth steps of a method of manufacturing the conventional interconnection structure of a semiconductor device.

Note that the local interconnection structure is provided to connect gate electrode 4 and active region 2a in the above each embodiment. However, the present invention is not limited thereto. The same effect can be obtained by forming a contact hole 35 connecting first active region 2a and second active region 2c, and providing a buried layer 36 in contact hole 35, as shown in FIG. 27, for example.

According to one aspect of the interconnection structure of a semiconductor device of the present invention, a metal buried layer can be formed to have a thickness approximately the same as the height of a contact hole provided in an interlayer insulating film. Therefore, the resistance value of the metal buried layer is sufficiently small, making it possible to implement a local interconnection structure with low resistance.

As a result, it is possible to provide an interconnection structure of a semiconductor device having high operation reliability while miniaturization of the device is maintained.

According to another aspect of the interconnection structure of a semiconductor device of the present invention, a buried conductive layer can be formed to have a thickness approximately the same as the height of a contact hole provided in an interlayer insulating film. A buried conductive layer with a sufficiently low resistance value is formed. Therefore, it is possible to implement a local interconnection structure with low resistance.

As a result, it is possible to provide an interconnection structure of a semiconductor device having high operation reliability with miniaturization of the device maintained.

According to one aspect of a method of manufacturing an interconnection structure of a semiconductor device of the present invention, the surface of a first conductive layer and the surface of a second conductive layer are not etched at the time of etching of a contact hole in an interlayer insulating film. Therefore, the contact hole can be formed easily. Further, at the time of etching of a first metal buried layer, the interlayer insulating film is not etched by an etchant used for etching the metal layer. Therefore, the first metal buried layer can be etched easily.

As a result, it is possible to implement an interconnection structure of a semiconductor device with higher dimensional precision more easily than a conventional local interconnection structure.

According to another aspect of the method of manufacturing an interconnection structure of a semiconductor device of the present invention, by using a local interconnection structure in which a first metal buried layer is formed in a first contact hole, a second contact hole and a second metal buried layer can be simultaneously formed in another region, making it possible to reduce the number of steps of manufacturing a semiconductor device by half.

As a result, it is possible to provide a method of manufacturing an interconnection structure of a semiconductor device which can reduce manufacturing cost of a semiconductor device.

According to a further aspect of the method of manufacturing an interconnection structure of a semiconductor device of the present invention, a second metal layer and an interconnection layer are formed simultaneously. Therefore, the number of steps of manufacturing a semiconductor device can be reduced.

As a result, it is possible to provide a method of manufacturing an interconnection structure of a semiconductor device which can reduce manufacturing cost of a semiconductor device.

According to a further aspect of the method of manufacturing an interconnection structure of a semiconductor device of the present invention, a first electrode is directly formed in a second metal buried layer. Therefore, the interconnection structure in a contact hole can be simplified.

As a result, it is possible to provide a method of manufacturing an interconnection structure of a semiconductor device which can reduce the number of steps and cost in the manufacturing steps of a semiconductor device.

According to a further aspect of the method of manufacturing an interconnection structure of a semiconductor device of the present invention, a third metal buried layer is formed in a third contact hole. Therefore, even if a second interlayer insulating film has a relatively large thickness, first and third contact holes formed in two stages can substantially reduce the aspect ratio in each contact hole.

Further, a first electrode can be formed above the local interconnection, and the semiconductor device can be further miniaturized.

According to a further aspect of the method of manufacturing an interconnection structure of a semiconductor device of the present invention, the surface of a first interlayer insulating film is flattened. Therefore, a third contact hole and a fifth contact hole have the same aspect ratio. As a result, the third contact hole and the fifth contact hole can be formed under the same condition.

As a result, it is possible to improve a margin in the manufacturing process of a semiconductor device, making it possible to provide a stable method of manufacturing a semiconductor device.

According to a further aspect of the method of manufacturing an interconnection structure of a semiconductor device of the present invention, it is possible to set small the aspect ratio of a contact hole formed on a second contact hole.

As a result, it is possible to directly form an interconnection layer in the contact hole portion.

According to a further aspect of the method of manufacturing an interconnection structure of a semiconductor device of the present invention, even if a first interlayer insulating film and a sidewall insulating film are formed of the same material, the sidewall insulating film is not etched at the time of formation of a first contact hole.

As a result, it is possible to prevent in advance generation of a defective portion in manufacturing an interconnection structure of a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection structure of a semiconductor device, comprising:

a first conductive layer;

a second conductive layer provided in the vicinity of said first conductive layer;

an interlayer insulating film covering said first conductive layer and said second conductive layer, and having a contact hole exposing a prescribed region of said first conductive layer and a prescribed region of said second conductive layer; and a refractory metal buried layer filling said contact hole and electrically connecting said first conductive layer and said second conductive layer.

2. An interconnection structure of a semiconductor device, comprising:

a gate electrode formed on a semiconductor substrate with an insulating film interposed therebetween and having its side face covered with a sidewall insulating film;

an active region formed in the vicinity of said gate electrode with a prescribed depth from a main surface of said semiconductor substrate;

an interlayer insulating film covering said gate electrode and said active region, and having a contact hole exposing a prescribed region of an upper surface of said gate electrode and a prescribed region of a main surface of said active region; and a refractory metal buried layer filling said contact hole and electrically connecting said gate electrode and said active region.

3. The interconnection structure of a semiconductor device as recited in claim 2, further comprising a nitride film on a surface of said sidewall insulating film.

* * * * *